United States Patent [19]

Su et al.

[11] Patent Number: 5,923,689
[45] Date of Patent: Jul. 13, 1999

[54] RED SEMICONDUCTOR LASER OF LOW BEAM DIVERGENCE

[75] Inventors: Yan-Kuin Su; Wen-Liang Li; Shoou-Jinn Chang; Chin-Yao Tsai, all of Tainan, Taiwan

[73] Assignee: National Science Council, Taiwan

[21] Appl. No.: 09/010,848

[22] Filed: Jan. 22, 1998

[51] Int. Cl.$^6$ ................ H01S 3/19; G02B 6/10
[52] U.S. Cl. ............................ 372/45; 385/131
[58] Field of Search ............... 372/45; 385/131; 257/96, 12

[56] References Cited

U.S. PATENT DOCUMENTS

| | | | |
|---|---|---|---|
| 5,165,105 | 11/1992 | Haase et al. | 385/131 |
| 5,282,218 | 1/1994 | Okajima et al. | 372/45 |
| 5,331,655 | 7/1994 | Harder et al. | 372/45 |

Primary Examiner—Rodney Bovernick
Assistant Examiner—Quyen P. Leung
Attorney, Agent, or Firm—Smith, Gambrell & Russell, LLP; Beveridge, DeGrandi, Weilacher & Young Intellectual Property Group

[57] ABSTRACT

This invention is a new type of GaInP/AlGaInP for a visible separate-confinement-heterostructure strained quantum well (SCH-S-QW) laser with passive wave guides in the cladding layers. By using this structure, we can significantly improve the transverse beam divergence with only a slight increase of the threshold current. With proper choice of parameters, the transverse beam divergence as narrow as 18°. FWHM can be achieved while the threshold current only becomes 1.12 factor than the lasers without the passive waveguide structure. This type of structure has three advantages:

(1) It increases the spectrum dissolution rate between the laser and its optic element to increase the efficiency in actual operation.

(2) Smaller oval ratio makes the light beams appears circular, and avoids the problem of non-paralleled focusing in optical instruments. It also eliminates cumbersome non-paralleled focusing in traditional GaInP/AlGaInP, and is more cost efficient.

(3) This structure expands the resonation cavity in the optic field. Thus, it can reduce the effect of COD, prolongs the laser's life cycle as a result, while also enhances the maximum output efficiency. Therefore, the visible laser of the separate-confinement-heterostructure, strained quantum-well found in this vertical consolidated passive waveguide structure has many advantages that can be used as a basis for laser development.

3 Claims, 7 Drawing Sheets

| | | |
|---|---|---|
| p-GaAs | p=4*10$^{19}$ | 2000Å |
| p-GaInP | p=1*10$^{18}$ | 100Å |
| p-Al$_{0.5}$In$_{0.5}$P | p=5*10$^{17}$ | 0.5um |
| p-(Al$_{0.6}$Ga$_{0.4}$)$_{0.5}$In$_{0.5}$P | p=5*10$^{17}$ | 2000Å |
| p-Al$_{0.5}$In$_{0.5}$P | p=5*10$^{17}$ | 7000Å |
| (Al$_{0.6}$Ga$_{0.4}$)$_{0.5}$In$_{0.5}$P | undoped | 900Å |
| Ga$_{0.42}$In$_{0.58}$P | undoped | 80Å |
| (Al$_{0.6}$Ga$_{0.4}$)$_{0.5}$In$_{0.5}$P | undoped | 900Å |
| n-Al$_{0.5}$In$_{0.5}$P | n=4*10$^{17}$ | 7000Å |
| n-(Al$_{0.6}$Ga$_{0.4}$)$_{0.5}$In$_{0.5}$P | n=4*10$^{17}$ | 2000Å |
| n-Al$_{0.5}$In$_{0.5}$P | n=4*10$^{17}$ | 0.5um |
| n-GaAs | n=2*10$^{18}$ | 0.5um |
| n-GaAs Substrate | | |

Passive Waveguide — Active Waveguide — Passive Waveguide

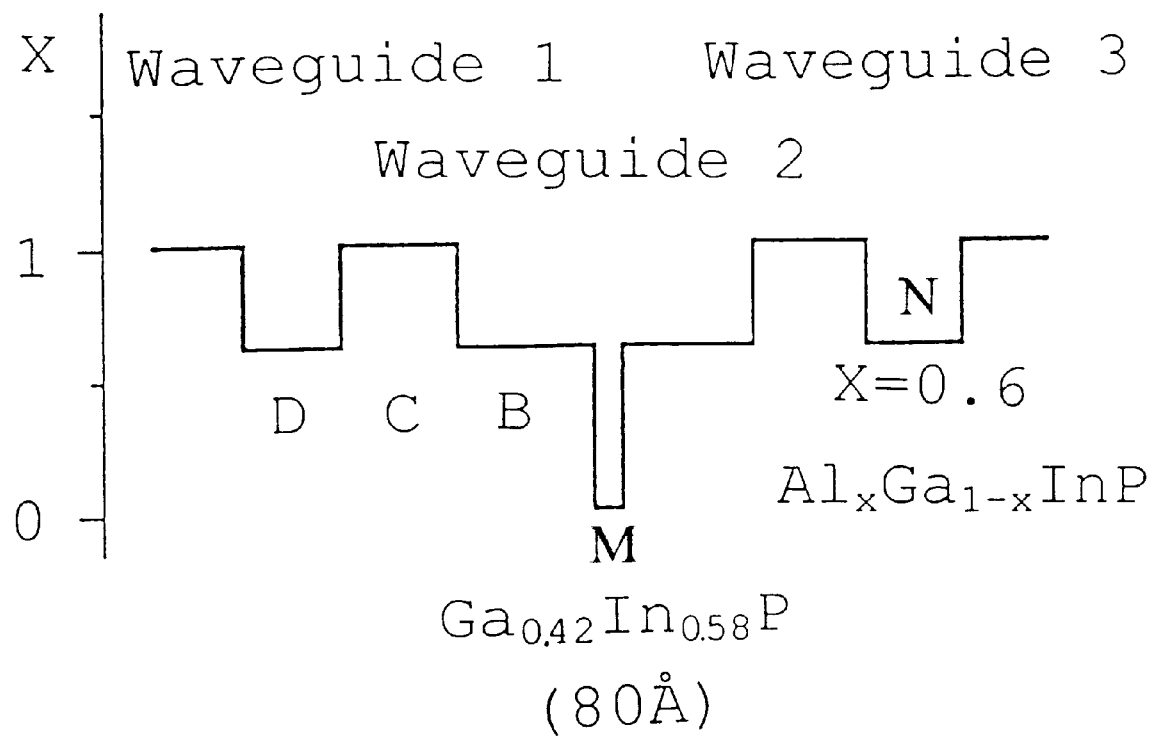
FIG. 1 (amended)

FIG. 5

| | | | |
|---|---|---|---|
| p-GaAs | p=4*10¹⁹ | 2000Å | |
| p-GaInP | p=1*10¹⁸ | 100Å | |
| p-Al₀.₅In₀.₅P | p=5*10¹⁷ | 0.5um | ⎫ |
| p-(Al₀.₆Ga₀.₄)₀.₅In₀.₅P | p=5*10¹⁷ | 2000Å | ⎬ Passive Waveguide |
| p-Al₀.₅In₀.₅P | p=5*10¹⁷ | 7000Å | ⎭ |
| (Al₀.₆Ga₀.₄)₀.₅In₀.₅P | undoped | 900Å | ⎫ |
| Ga₀.₄₂In₀.₅₈P | undoped | 80Å | ⎬ Active Waveguide |
| (Al₀.₆Ga₀.₄)₀.₅In₀.₅P | undoped | 900Å | ⎭ |
| n-Al₀.₅In₀.₅P | n=4*10¹⁷ | 7000Å | ⎫ |
| n-(Al₀.₆Ga₀.₄)₀.₅In₀.₅P | n=4*10¹⁷ | 2000Å | ⎬ Passive Waveguide |
| n-Al₀.₅In₀.₅P | n=4*10¹⁷ | 0.5um | ⎭ |
| n-GaAs | n=2*10¹⁸ | 0.5um | |
| n-GaAs Substrate | | | |

RED SEMICONDUCTOR LASER OF LOW BEAM DIVERGENCE

FIELD OF APPLICATIONS

This invention is a new type of GaInP/AlGainP for a visible separate-confinement-heterostructure strained quantum well (SCH-S-QW) laser with passive waveguides in the cladding layers.

BACKGROUND OF INVENTION OR CREATION

In recent years, the visible semiconductor laser has become the best light source for many signal processing systems, such as high-speed CD-ROM memory system, high-speed laser printers, bar-code scanner, and digital video-disc systems. With the range of 600 nm wavelength used in these systems, $(Al_xGa_{1-x})_yIn_{1-y}P$ four-element alloy is the most suitable material because this material has the largest energy gap among those used in the chip slot and the GaAs baseboard in the III–V group of semiconductors.

As laser output must dissolved with other optical elements, the characteristics of its output light beam appear exceptionally important. For example in an optic fiber system, smaller laser light beams' divergent angle will increase its efficiency in dissolving with fiber optics. In a digital video-disc system, it further confines far-range vertical divergent angle to be lower than 25°. Unfortunately, in traditional separate-confinement-heterostructure quantum well laser, the light has to be confined as possible as in the active layer (the quantum well) to reduce threshold current. The result of closely concentrated light in the resonation cavity tends to cause very large far-range divergent angle ($\theta\perp$)which reduces the dissolving efficiency with other optical elements. In addition, the dense focus of this type of light beam will also cause premature occurrence of COD, which causes reduction in the laser's life span and confines the laser's maximum output efficiency.

CROSS-REFERENCE TO RELATED APPLICATIONS

In order to overcome this problem, until 1996, different structures of laser diodes featured with GaAs and inGaAs are used in amplifying the size of light in the resonation cavity According to reports published by J. Temmyo and M. Sugo, et al, in the 1995 Electronic Letters, Volume 31, pp. 6421–644, for a depressed cladding structure; the report published in 1992 by M. Hong, et al, in J. Vac. Sci. Technol., Volume B10, p. 989–991 for a multi-cycled passive waveguide structure; the report published in 1991 by M. C. Wu, et al, in Appl. Phys. Lett., Volume 59, pp. 1046–1048 for applying GaAs/AlGaAs or InGaAs/AlGaAs materials in non-visible semiconductor laser; the reports published in 1996 by S. T. Yen and C. P. Lee, et al, in IEEE J. Quantum Electronic, Volume QE-32, pp. 4–13 for a dissolved-mode theoretical calculation model; and the report published in 1991 by T. M. Cockerill, et al, in Appl. Phys. Lett., Volume 59, pp. 2694–2696, all have failed to perfect the structure. Yet the known technology disclosed above has certain production difficulties as some may result in drastic increase of the threshold current. Therefore, all these methods are not suitable.

SUMMARY OF THE INVENTION

The prime objective of this invention is to propose a production method for an infra-red semiconductor laser component that has low far-range divergent angle. Its structure consists of taking traditional GaInP/AlGaInP visible wavelength separate-confinement-heterostructure quantum well and add a vertical integrated passive waveguide into its cladding layer to obtain a separate-confinement-heterostructure quantum well structure which is unlike those in the past.

One other objective of this invention is in using the design from the transfer matrix theory to obtain the best structure that has the smallest far-range divergent angle.

BRIEF DESCRIPTION OF THE DRAWINGS

Table 1 The characteristics of GaInP/AlGaInP visible semiconductor laser at the optimal condition FIG. 1 The structural drawing of the conducting strip of a GaInP/AlGaInp single quantum well laser with integrated active waveguide and passive waveguide.

1 and 3 . . . Passive waveguide 2 . . . Integrated active waveguide

B . . . Width of the light confinement layer in the active waveguide

D . . . Width of the well in passive waveguide

C . . . Width of the location barrier layer

M . . . $Ga_{0.42}In_{0.57}P$(80 Å) N . . . $Al_xGa_{1-x}InP$ X=0.6

Figure 2:
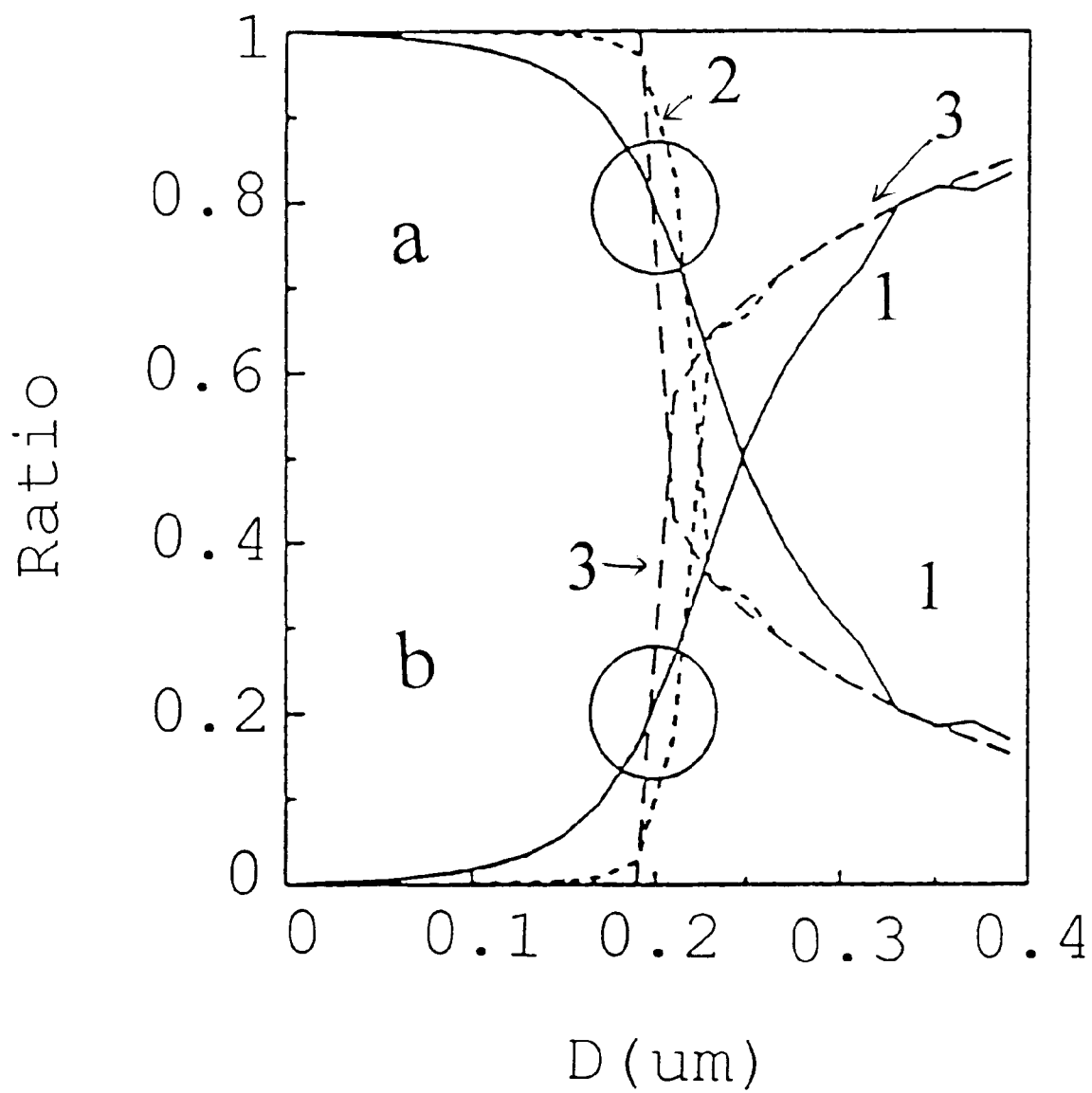

FIG. 2 The drawing of the ratio of in-phase intensity (in active waveguide) and out-phase intensity (in passive waveguide) with changes in the width of well of passive waveguide.

a. . . . In-phase in the active waveguide b. . . . Out phase in the passive waveguide D . . . Width of well of the passive waveguide 1 . . . Solid line, width of passive waveguide's location barrier layer C=0.4 μm 2 . . . dash line, width of passive waveguides' location barrier layer C=0.7 μm 3 . . . long dash line, width of passive waveguides' location barrier layer C=1 μm FIGS. 3(a)–3(b) A three-dimensional drawing of changes in the well width (C) of passive waveguide and width of location barrier layer(D).

Figure 3A:
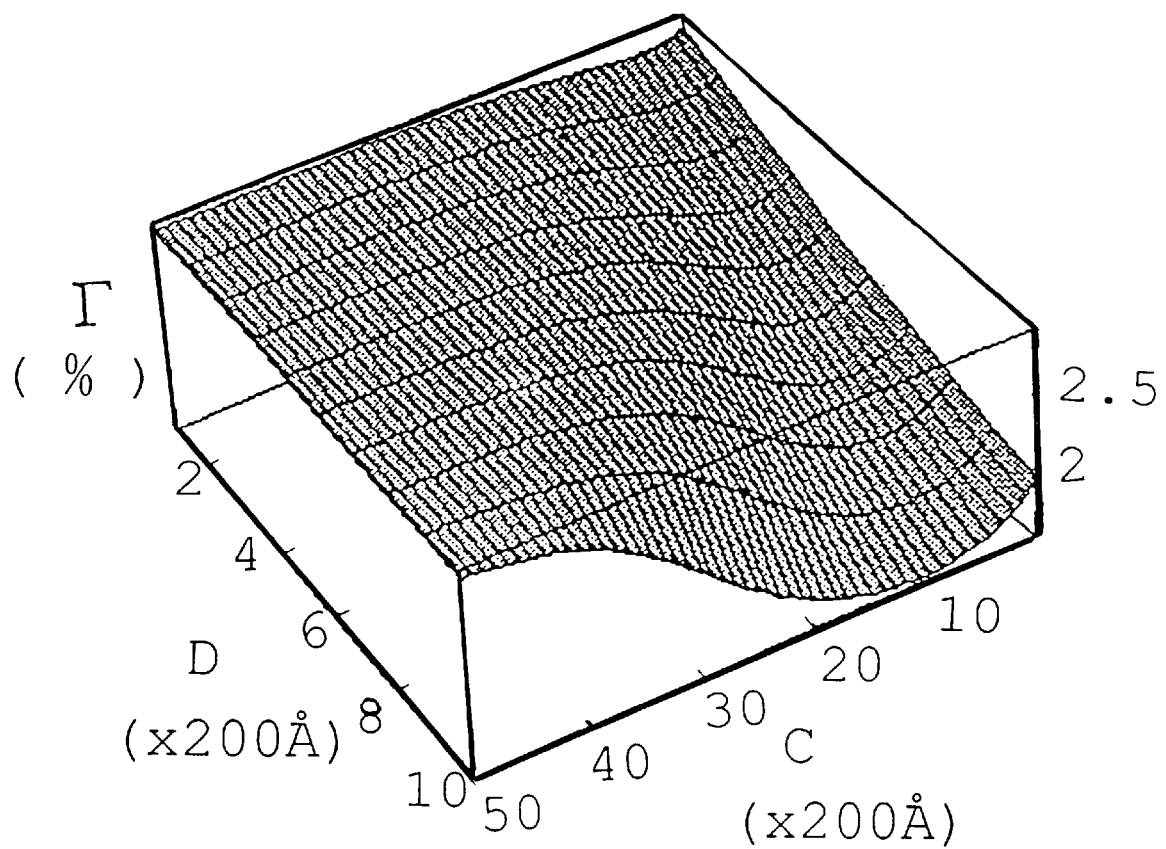

FIG. 3(a) Light confinement factor

Figure 3B:
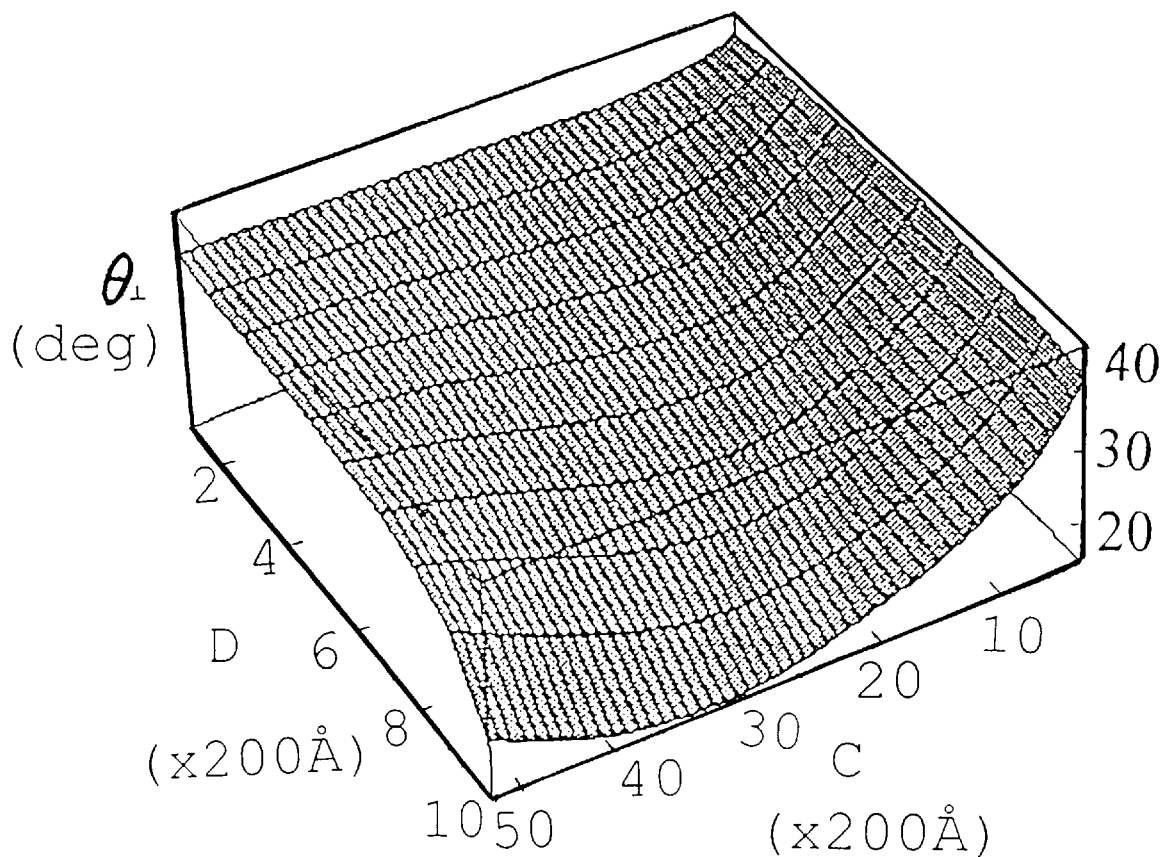

FIG. 3(b) Far-range vertical divergent angle

C . . . well width    D . . . width of location barrier layer

Figure 4A:
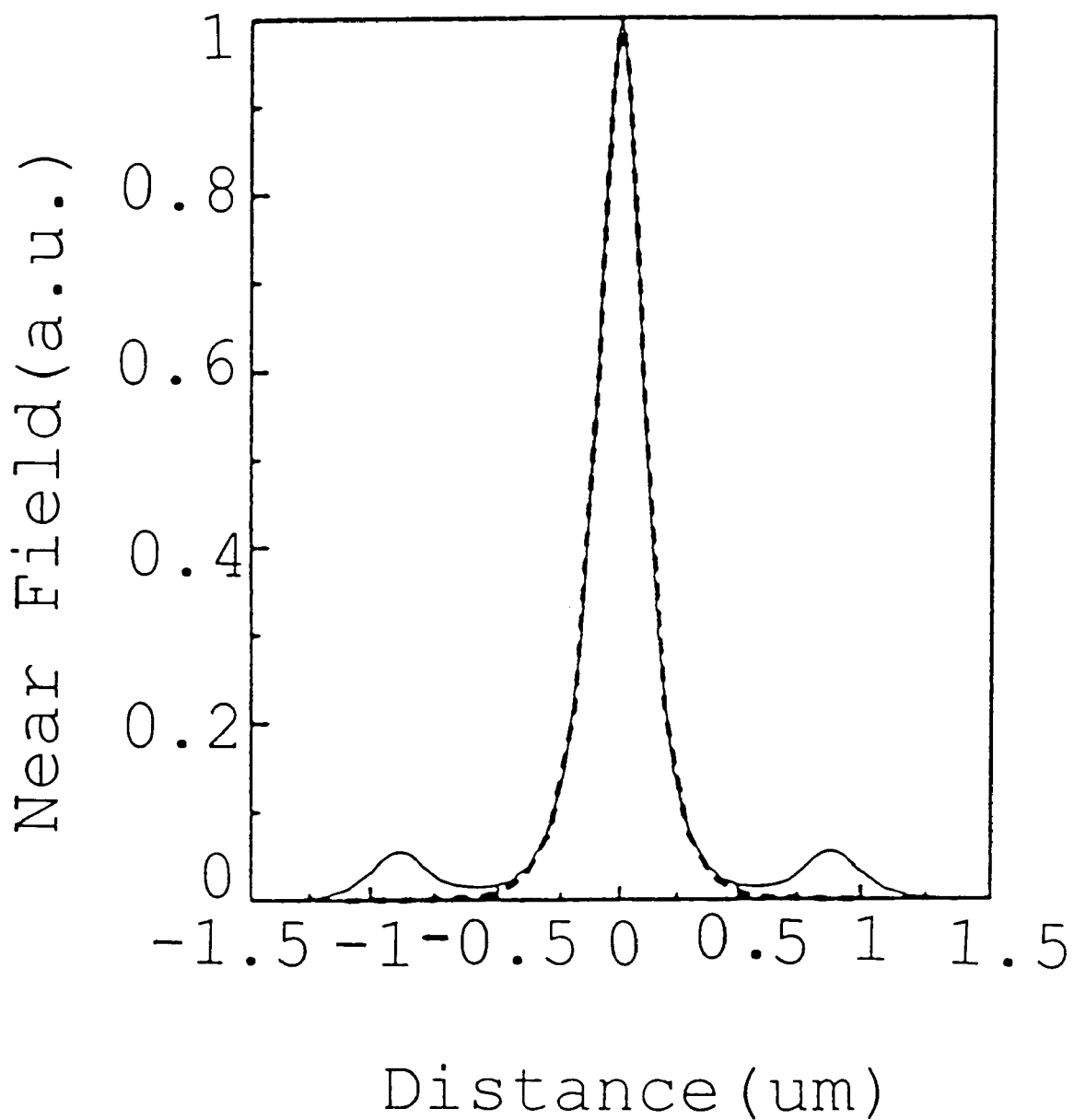
Figure 4B:
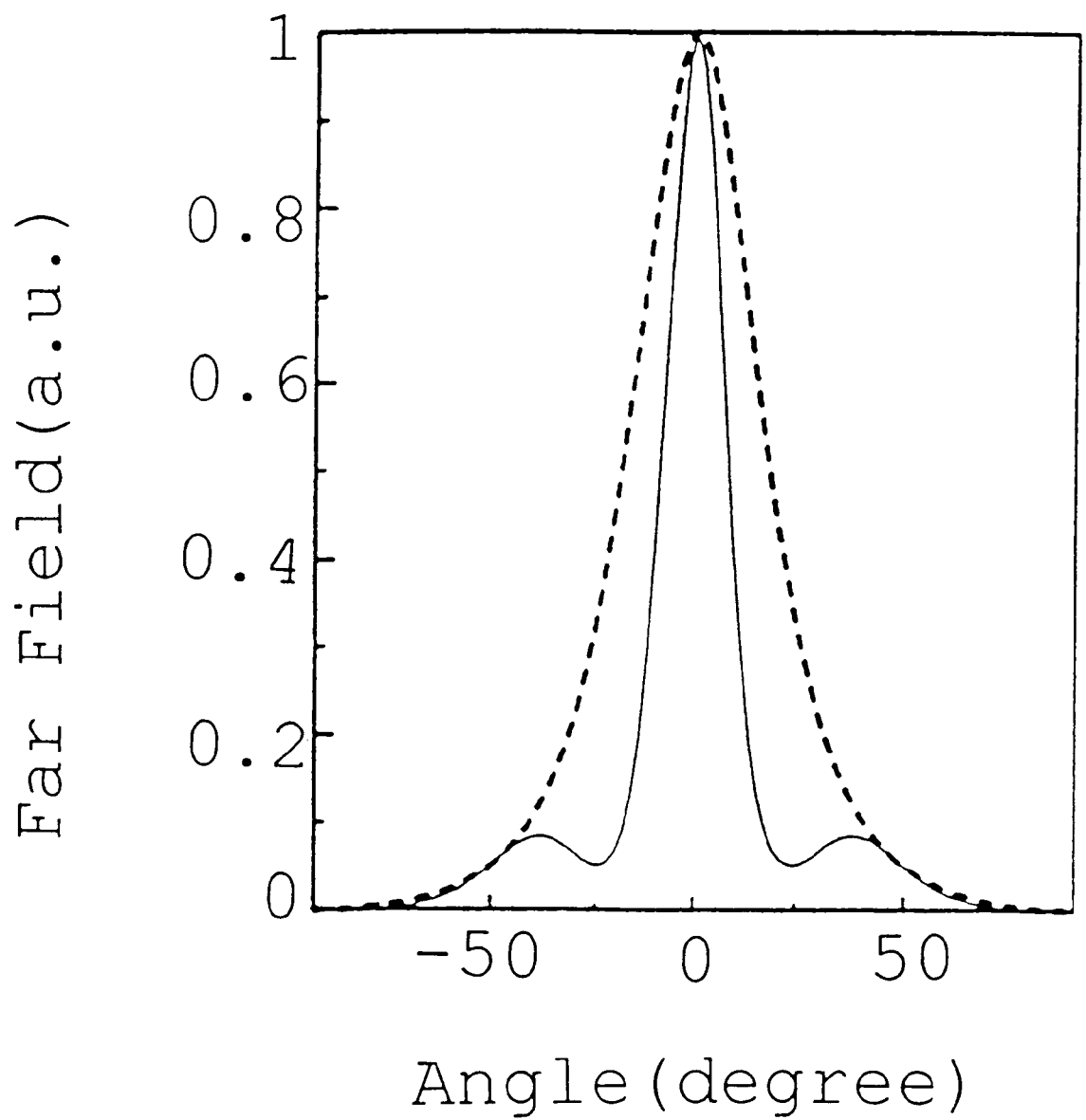

FIGS. 4(a)–4(b) Calculated (a) Near- and (b) Far-field pattern perpendicular to the junction at the optimal conditions of GaInP/AlGaInP infra-red semiconductor optimal conditions are shown in FIGS. 3(a) and 3(b), where C=0.7 μm, D=0.2 μm)

(a) Near-range distribution (b) Far-range distribution

Solid . . . Laser with passive waveguide structure dash link . . . Laser without passive waveguide structure FIG. 5 The structural drawing of the GaInP/AlGaInp separated-confinement-heterostructure quantum well visible wavelength semiconductor laser with vertically integrated passive waveguide.

DETAILED DESCRIPTION OF THE INVENTION

With respect to GaInP/AlGaInP visible wavelength separate-confinement-heterostructure quantum well laser, no one has yet considered the issue of far-range divergent angle. As visible laser becomes increasingly important, and its applications become increasingly extensive in the future, this issue will become more crucial.

For traditional infra-red semiconductor laser with separate-confinement-heterostructure quantum well, its far-range divergent angle is about 30°~40°. This invention's new laser component structure may reduce far-range divergent angle to 18°, and may resolve the problems of divergent angle in modern industry. Therefore, the structure and conditional parameters are a basis for the design of visible laser in the future.

This invention is a multi-layered, multi-step, quantum well laser diode with low far-range divergent angle which employs laser diode component with GaInP/AlGaInp visible SCH-QW structure that contains passive waveguide structure. This new structure has the advantages of increasing effective output efficiency, conserving the cost of non-paralleled focus in optical instruments, and increasing operating life span, etc., and may resolve the problem of divergent angle in the existing industry. For high-density read/write CD memory system, this new laser structure may increase its retrieval amount, conserve cost for extra optical components, and even contains application value for the industry. Moreover, it is valuable to bar-code scanner and digital video-disc system, etc., and it is highly feasible for industrial mass production. "An infra-red semiconductor laser component with low far-range divergent angle" proposed by this invention is different from the known "depressed cladding structure" used by J. Temmyo, et al, as this invention uses passive waveguide structure. Also, its use of single layer passive waveguide structure is different from the multi-cycled passive waveguide structure used by M. Hong, et al. Therefore, the design of basic structure is different. M. C. Wu, et al, apply GaAs/AlGaAs or InGaAs/AlGaAs materials in invisible light semiconductor laser; whereas this invention applies the infra-red semiconductor laser with GaInP/AlGaInP material, thus the basic applied material and components are not the same. S. T. Yen, et al, utilize dissolving theoretical calculation model, yet this invention uses transfer square theoretical calculation model, thus the theoretical model used is different. M. Cockerill, et al, have not perfected the production of semiconductor laser structure, yet this invention perfects the processing of components so that the infra-red semiconductor laser structure is equipped with more advantages.

Therefore, this invention proposes a new type of structure which vertically integrates the SCH-QW structure and two passive waveguide structures inserted in the cladding layers. Through theory simulation, the parameters for a best structure is obtained that can clearly reduce far-range divergent angle, without causing drastic increase in threshold current. Thus, it is deemed the best solution for the aforementioned problem. This structure and the conditional parameters will be used as the basis for design of visible light laser in the future.

In order to locate the best visible light laser structure, we use transfer matrix method to calculate GaInP/AlGaInP that contains passive waveguide (the exciting wavelength is 670 nm) SCH-QW laser. Through the method of transfer matrix method, the laser optical range's distribution, and its optical confinement factor in the active layer, within the optical resonation cavity may be obtained directly. Then, through the optical range's Fourier conversion, its far-range distribution and its FWHM may be obtained.

The relationship between the guiding belt and structure for this structure is as shown in FIG. 1. It is a traditional separate-confinement-heterostructure active waveguide structure (labeled as waveguide 2) combined with two passive waveguide structures (labeled as waveguide 1 and waveguide 3). Among which, B is the width of the confinement layer in the active waveguide, while D and C are respectively the well width, and width of the location barrier layer, of the passive waveguide. Quantum well is $Ga_{0.42}In_{0.58}P$ which may be compressed and strained; in order to achieve exciting wavelength of 670 nm, its width is set at 80 Å.

To obtain the optimal structural conditions, B, C and D values must be selected carefully, and their relationships understood. Through theoretical calculation, in the traditional GaInP/AlGaInP (with wavelength of 670 nm) visible light SCH-QW laser, when the light confinement layer's width is 900 Å, there is a maximum optical confinement factor ($\Gamma$). This means, there is a lowest threshold current ($I_{th}$), because threshold current and the optical confinement factor are inversely related Therefore, in this structure, we limit B to 900 Å to obtain maximum optical confinement factor with the lowest threshold current. When passive waveguide structure is added, a higher phase light will appear; and its appearance will result in variation of far-range divergent angle. Therefore, in order to obtain low divergent anglers single-peak far-range distribution, we study the proportional relationship of in-phase intensity (in waveguide 2) and out-phase intensity (in waveguide 1 and 3) under different values of C and D. FIG. 2 indicates proportions of in-phase intensity and out-phase intensity with changes in D value. In which, the solid line, dash line and the long dash line are respectively C=0.4 $\mu$m, 0.7 $\mu$m, and 1 $\mu$m. We can clearly see that with increasing well width D of passive waveguide, in-phase intensity reduces while out-phase intensity increases. Moreover, the interaction point between in-phase and out-phase intensities increases with C value and tends toward smaller D. This is because under a larger C value, the dissolving effect between the active waveguide and the passive waveguide is poorer. When the well width D reaches a certain threshold value, as most of the light will be confined within the waveguide, the out-phase intensity will increase rapidly.

FIG. 3($a$) and 3($b$) are respectively the three-dimensional sketch of the optical confinement factor and far-range vertical divergent angle as C and D changes. Under a fixed C value, as the out-phase intensity increases with the increase in well width of the passive waveguide, as shown in FIG. 2, this indicates that the optical range distribution disperses as D increases. Therefore, this causes the optical confinement factor ($\Gamma$) and far-range divergent angle ($\theta\perp$) to reduce as D increases. Under a fixed D value, the optical confinement factor and far-range divergent angle will first decrease as C value increases and will increase again after that. When C value is smaller, the increase in C value will result in the dispersion of the light range, result in decline. But when the C value is larger, as the dissolution of active waveguide and passive waveguide will decline as C increases, the out-phase intensity will decline causing the optical confinement factor and far-range divergent angle to increase as C increases. Fortunately, we may observe from FIGS. 3($a$) and 3($b$) that the smallest values of the optical confinement factor and far-range divergent angle do not occur at the same C value. This is due to the slow contraction of Fourier conversion. Therefore, we may utilize appropriate selection of C and D values to modify far-range divergent angle, and ensure that the optical confinement factor will not be reduced by too much. From FIGS. 3($a$) and 3($b$), the optimal condition we obtain is C=0.7 $\mu$m, D=0.2 $\mu$m. FIGS. 4($a$) and 4($b$) are respectively the near-range and far-range distribution diagrams of GaInP/AlGaInP quantum well laser under this condition. In which, the optical confinement factor and far-range divergent angle are 2.6% and 18° respectively. GaInP/AlGaInP quantum well laser without using passive waveguide structure is shown in dash lines in FIGS. 4(a) and 4(b), in which the optical confinement factor and far-range divergent angle are 2.9% and 38° respectively. Although the decline of the optical confinement factor from 2.9% to 2.6% by a 0.3% causes the threshold current to increase by 0.12 time, this structure which contains passive waveguide will clearly reduce far-range divergent angle (from 38° to 18°). After inserting two passive waveguide structures in traditional separate-confinement-heterostructure quantum well laser's cladding layer, and selecting the structural parameters appropriately, we may obtain the best laser photoelectric characteristics as shown in Table 1.

The structure of the visible light semiconductor laser with passive waveguide under the optimal condition is as shown in FIG. 5. It is divided into 13 structural layers, besides the contact metal:

(1) N-type GaAs wafer;

(2) 0.4 μm, n-type GaAs buffer layer with concentration of $2 \times 10^{18}$ cm$^{-3}$;

(3) 0.5 μm, n-type Al$_{0.5}$In$_{0.5}$P cladding layer with concentration of $4 \times 10^{17}$ cm$^{-3}$;

(4) 2,000 Å, n-type (Al$_{0.6}$Ga$_{0.4}$)$_{0.5}$In$_{0.5}$P passive waveguide well with concentration of $4 \times 10^{17}$ cm$^{-3}$;

(5) 7,000 Å, n-type Al$_{0.50}$In$_{0.5}$P passive waveguide energy barrier layer with concentration of $4 \times 10^{17}$ cm$^{-3}$;

(6) 900 Å, intrinsic(Al$_{0.6}$Ga$_{0.4}$)$_{0.5}$In$_{0.5}$P optical confinement layer;

(7) 80 Å, intrinsic Ga$_{0.42}$In$_{0.58}$P strain quantum well;

(8) 900 Å, intrinsic (Al$_{0.6}$Ga$_{0.4}$)$_{0.5}$In$_{0.5}$P optical confinement layer;

(9) 7,000 Å, P-type Al$_{0.50}$In$_{0.5}$P passive waveguide energy barrier layer with concentration of $5 \times 10^{17}$ cm$^{-3}$;

(10) 2,000 Å, P-type (Al$_{0.6}$Ga$_{0.4}$)$_{0.5}$In$_{0.5}$P passive waveguide well with concentration of $5 \times 10^{17}$ cm$^{-3}$;

(11) 0.5 μm, P-type Al$_{0.50}$In$_{0.5}$P cladding layer with concentration of $5 \times 10^{17}$ cm$^{-3}$;

(12) 100 Å, P-type GaInP with concentration of $1 \times 10^{18}$ cm$^{-3}$;

(13) 2,000 Å, P-type GaAs conductive layer with concentration of $4 \times 10^{19}$ cm$^{-3}$.

This type of structure has three major advantages:

(1) It increases the optical dissolving efficiency of laser and other optical components which increases its efficiency in actual operation.

(2) Smaller oval proportion causes optical beams to incline toward a round-shape, eliminates the trouble of non-paralleled focus in optical instruments, and saves costs.

(3) In traditional GaInP/AlGaInP visible light laser, detrimental optical deficiency(COD) is the most serious problem. It reduces the laser's life span and confines its maximum output efficiency. This structure will amplify the optical range in the resonation cavity which reduces the COD effect. As a result, this type of vertical integrated passive waveguide for separate-confinement-heterostructure quantum well visible light laser has many advantages which may be used as a basis for laser development in the future.

TABLE 1

| Material | GaInP/AlGaInP |
|---|---|
| B(um) | 0.09 |
| C(um) | 0.7 |
| D(um) | 0.2 |
| Far-range distribution and its half-height width (°) | 18(38) |
| Confinement factor (%) | 2.6(2.9) |
| Estimated Threshold Current | 1.12 factor |

What is claimed is:

1. A new type of GaInP/AlGaInP structure which includes:

(1) N-type GaAs wafer;

(2) 0.4 μm, n-type GaAs buffer layer with a concentration of $2 \times 10^{-}$cm$^{-3}$;

(3) 0.5 μm, n-type Al$_{0.5}$In$_{0.5}$P cladding layer with a concentration of $4 \times 10^{17}$ cm$^{-3}$;

(4) 2,000 Å, n-type (Al$_{0.6}$Ga$_{0.4}$)$_{0.5}$In$_{0.5}$P passive waveguide well with a concentration of $4 \times 10^{17}$ cm$^{-3}$;

(5) 7,000 Å, n-type Al$_{0.50}$In$_{0.5}$P passive waveguide energy barrier layer with a concentration of $4 \times 10^{17}$ cm$^{-3}$;

(6) 900 Å, intrinsic(Al$_{0.6}$Ga$_{0.4}$)$_{0.5}$In$_{0.5}$P optical confinement layer;

(7) 80 Å, intrinsic Ga$_{0.42}$In$_{0.58}$P strain quantum well;

(8) 900 Å, intrinsic(Al$_{0.6}$Ga$_{0.4}$)$_{0.5}$In$_{0.5}$P optical confinement layer;

(9) 7,000 Å, P-type Al$_{0.50}$In$_{0.5}$P passive waveguide energy barrier layer with a concentration of $5 \times 10^{17}$ cm$^{-3}$;

(10) 2,000 Å, P-type(Al$_{0.6}$Ga$_{0.4}$)$_{0.5}$In$_{0.5}$P passive waveguide well with a concentration of $5 \times 10^{17}$ cm$^{-3}$;

(11) 0.5 μm, P-type Al$_{0.50}$In$_{0.5}$P cladding layer with a concentration of $5 \times 10^{17}$ cm$^{-3}$;

(12) 100 Å, P-type GaInP with a concentration of $1 \times 10^{18}$ cm$^{-3}$;

(13) 2,000 Å, P-type GaAs conductive layer with a concentration of $4 \times 10^{19}$ cm$^{-3}$.

2. The structure of GaInP/AlGaInP claimed as claim 1, this new structure which reduces far-range divergent angle is obtained through the addition of passive waveguide structure to the cladding layer of traditional GaInP/AlGaInP semiconductor laser.

3. A new type of GaInP/AlGaInP structure used in visible light semiconductor laser which includes:

(1) N-type GaAs wafer;

(2) 0.4 μm, n-type GaAs buffer layer with a concentration of $2 \times 10^{18}$ cm$^{-3}$;

(3) 0.5 μm, n-type Al$_{0.5}$In$_{0.5}$P cladding layer with a concentration of $4 \times 10^{17}$ cm$^{-3}$;

(4) 2,000 Å, n-type (Al$_{0.6}$Ga$_{0.4}$)$_{0.5}$In$_{0.5}$P passive waveguide well with a concentration of $4 \times 10^{17}$ cm$^{-3}$;

(5) 7,000 Å, n-type Al$_{0.50}$In$_{0.5}$P passive waveguide energy barrier layer with a concentration of $4 \times 10^{17}$ cm$^{-3}$;

(6) 900 Å, intrinsic(Al$_{0.6}$Ga$_{0.4}$)$_{0.5}$In$_{0.5}$P optical confinement layer;

(7) 80 Å, intrinsic $Ga_{0.42}In_{0.58}P$ strain quantum well;
(8) 900 Å, intrinsic $(Al_{0.6}Ga_{0.4})_{0.5}In_{0.5}P$ optical confinement layer;
(9) 7,000 Å, P-type $Al_{0.50}In_{0.5}P$ passive waveguide energy barrier layer with a concentration of $5\times10^{17}$ $cm^{-3}$;
(10) 2,000 Å, P-type $(Al_{0.6}Ga_{0.4})_{0.5}In_{0.5}P$ passive waveguide well with a concentration of $5\times10^{17}$ $cm^{-3}$;
(11) 0.5 μm, P-type $Al_{0.50}In_{0.5}P$ cladding layer with a concentration of $5\times10^{17}$ $cm^{-3}$;
(12) 100 Å, P-type GaInP with a concentration of $1\times10^{18}$ $cm^{-3}$;
(13) 2,000 Å, P-type GaAs conductive layer with a concentration of $4\times10^{19}$ $cm^{-3}$.

* * * * *